(12) United States Patent
Matsuda

(10) Patent No.: US 11,890,719 B2
(45) Date of Patent: Feb. 6, 2024

(54) METHOD OF POLISHING SILICON WAFER

(71) Applicant: SUMCO CORPORATION, Tokyo (JP)

(72) Inventor: Shuhei Matsuda, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 1000 days.

(21) Appl. No.: 16/607,941

(22) PCT Filed: Oct. 17, 2017

(86) PCT No.: PCT/JP2017/037596
§ 371 (c)(1),
(2) Date: Oct. 24, 2019

(87) PCT Pub. No.: WO2019/077687
PCT Pub. Date: Apr. 25, 2019

(65) Prior Publication Data
US 2020/0306922 A1    Oct. 1, 2020

(51) Int. Cl.
*B24B 37/005* (2012.01)
*B24B 37/04* (2012.01)
(Continued)

(52) U.S. Cl.
CPC .......... *B24B 37/245* (2013.01); *B24B 37/005* (2013.01); *B24B 37/0056* (2013.01);
(Continued)

(58) Field of Classification Search
CPC ..... B24B 37/042; B24B 37/044; B24B 37/08; B24B 37/28; B24B 37/005;
(Continued)

(56) References Cited

U.S. PATENT DOCUMENTS 8,286,344 B2 * 10/2012 Sakamoto ........... H01L 21/3212
29/847
8,877,643 B2 * 11/2014 Matsuda ............... B24B 37/044
438/959
(Continued)

FOREIGN PATENT DOCUMENTS

CN    105479324 A  *  4/2016  ............. B24B 37/00
DE    102007037964 A1 * 2/2009  ........... B24B 37/042
(Continued)

OTHER PUBLICATIONS

Taiwanese Office Action for Taiwanese Patent Application No. 10920029030, dated Jan. 9, 2020; and English-language translation thereof.
(Continued)

*Primary Examiner* — Eileen P Morgan
(74) *Attorney, Agent, or Firm* — Greenblum & Bernstein, P.L.C.

(57) ABSTRACT

In a method of polishing a silicon wafer, a final polishing step includes an upstream polishing step and a subsequent finish polishing step. In the upstream polishing step, as a polishing agent, a first alkaline aqueous solution containing abrasive grains with a density of $1\times10^{14}/cm^3$ or more is first supplied, and the supply is then switched to a supply of a second alkaline aqueous solution containing a water-soluble polymer and abrasive grains with a density of $5\times10^{13}/cm^3$ or less. In the finish polishing step, as a polishing agent, a third alkaline aqueous solution containing a water-soluble polymer and abrasive grains with a density of $5\times10^{13}/cm^3$ or less is supplied. Thus, the formation of not only PIDs but also scratches with small depth can be suppressed.

9 Claims, 4 Drawing Sheets

(51) Int. Cl.
*B24B 37/10* (2012.01)
*B24B 37/24* (2012.01)
*B24B 37/34* (2012.01)
*B24B 37/015* (2012.01)

(52) U.S. Cl.
CPC ............ *B24B 37/044* (2013.01); *B24B 37/34* (2013.01); *B24B 37/015* (2013.01)

(58) Field of Classification Search
CPC ... B24B 37/0056; B24B 37/013; B24B 49/02; B24B 49/16; B24B 57/02; B24B 1/00; B24B 7/228; B24B 37/04; B24B 37/10; B24B 37/14; B24B 37/24; B24B 37/34
USPC .................. 451/36, 37, 41, 57, 59, 285, 287
See application file for complete search history.

(56) References Cited

U.S. PATENT DOCUMENTS

| | | | |
|---|---|---|---|
| 9,956,663 B2* | 5/2018 | Kozasa | B24B 37/10 |
| 2009/0298393 A1* | 12/2009 | Kozasa | B24B 37/042 |
| | | | 451/60 |
| 2012/0080775 A1 | 4/2012 | Matsuda et al. | |
| 2013/0109180 A1 | 5/2013 | Tanimoto et al. | |
| 2016/0099156 A1* | 4/2016 | Yamaguchi | H01L 21/02065 |
| | | | 438/692 |
| 2018/0030313 A1 | 2/2018 | Tsuchiya | |
| 2020/0043748 A1* | 2/2020 | Liu | H01L 21/30625 |
| 2020/0185215 A1* | 6/2020 | Tanimoto | H01L 21/302 |
| 2021/0069855 A1* | 3/2021 | Chen | B24B 37/26 |
| 2022/0306900 A1* | 9/2022 | Mae | C09G 1/02 |

FOREIGN PATENT DOCUMENTS

| | | | |
|---|---|---|---|
| JP | 9-102475 A | 4/1997 | |
| JP | 09102475 A * | 4/1997 | ............. B24B 37/26 |
| JP | 11-140427 A | 5/1999 | |
| JP | 2011-165909 A | 8/2011 | |
| JP | 2014-4658 A | 1/2014 | |
| JP | 2016-051763 A | 4/2016 | |
| KR | 10-2012-0023752 A | 3/2012 | |
| KR | 10-2017-0038865 A | 4/2017 | |
| KR | 10-2017-0113539 A | 10/2017 | |
| TW | 201108316 | 3/2011 | |
| TW | 201618897 | 6/2016 | |
| WO | 2010/140671 | 12/2010 | |
| WO | 2012/005289 A1 | 1/2012 | |
| WO | WO 2016/129215 A1 | 8/2016 | |
| WO | WO-2019043895 A1 * | 3/2019 | ........... B24B 37/042 |

OTHER PUBLICATIONS

Office Action for DE App. No. 11 2017 007 930.6, dated Aug. 12, 2022 (w/ translation).
Office Action for KR App. No. 10-2019-7024136, dated Jun. 2, 2021 (w/ translation).
Office Action for TW App. No. 11020242310, dated Mar. 16, 2021 (w/ translation).
IPRP for PCT/JP2017/037596 dated Apr. 21, 2020 (w/ translation).
International Search Report issued in International Patent Application No. PCT/JP2017/037596, dated Dec. 19, 2017; and English-language translation thereof.
Opinion Notice (Office Action) issued in Taiwanese Patent Application No. 10820618670, dated Jul. 1, 2019, along with an English translation thereof.
Written Opinion of the International Searching Authority for International Patent Application No. PCT/JP2017/037596, dated Dec. 19, 2017.
Notice of Refusal (Office Action) issued in Japanese Patent Application No. 2019-517872, dated Dec. 17, 2019; and English-language translation thereof.
Office Action for CN App. No. 201780090843.7, dated Mar. 9, 2023 (w/ translation).

* cited by examiner

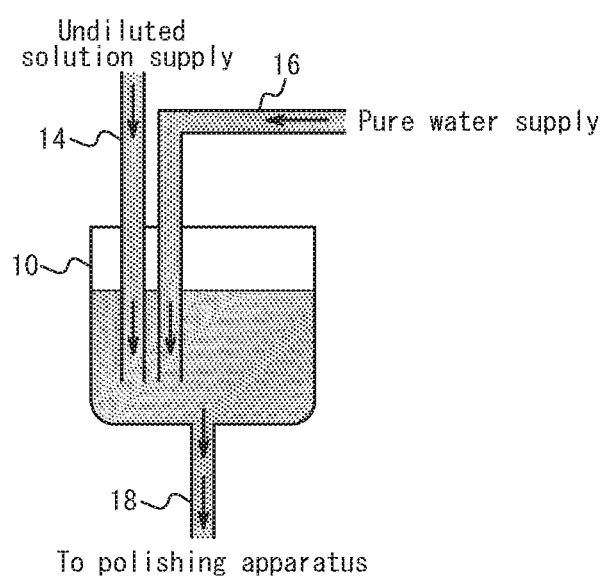

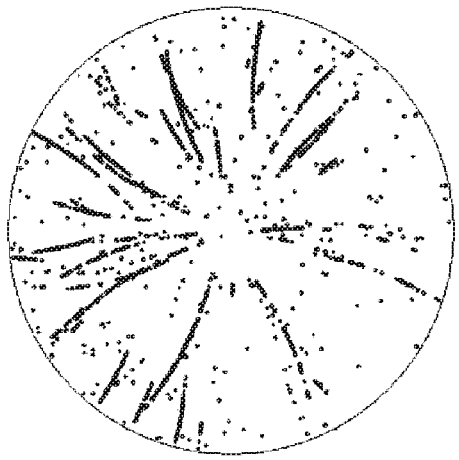
Comparative Example 1
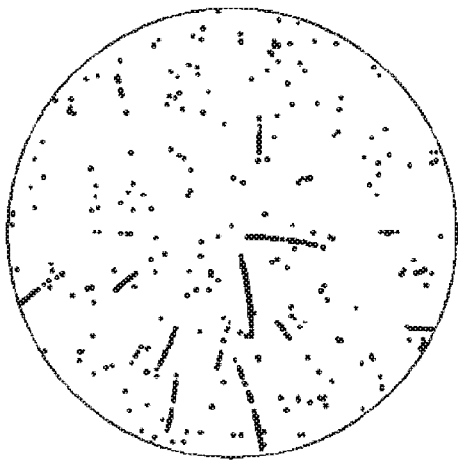
Comparative Example 2
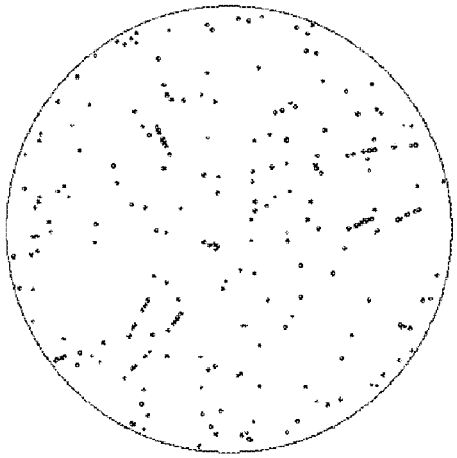
Example 1
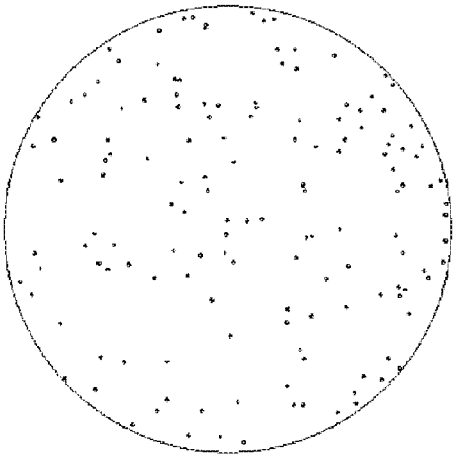
Example 2

METHOD OF POLISHING SILICON WAFER

TECHNICAL FIELD

This disclosure relates to a method of polishing a silicon wafer, which has a significance in a final polishing step of mirror polishing one side of a silicon wafer having been subjected to double-side polishing.

BACKGROUND

A process for producing a silicon wafer mainly includes a single crystal pulling step for forming a single crystal ingot and a step of processing the formed single crystal ingot. This processing step typically includes a slicing step, a lapping step, a beveling step, an etching step, a mirror polishing step, a cleaning step, etc., and through these steps, a silicon wafer having a mirror-finished surface is produced.

In the mirror polishing step, polishing is performed in multiple stages of for example, a double-side polishing step (lapping step) of simultaneously polishing both sides of a silicon wafer, followed by a final polishing step of mirror-finishing one side of the silicon wafer. The final polishing is usually performed using a polishing unit including a plate provided with a polishing pad on its surface, and a head for retaining a silicon wafer. One side of a silicon wafer retained on the head is pressed against the polishing pad, and the head and the plate are rotated together while supplying, to the polishing pad, a polishing solution (polishing slurry) which is an alkaline aqueous solution containing abrasive grains. Thus, one side of the silicon wafer is made to be a mirror-like surface having excellent smoothness by polishing using mechanochemical polishing (i.e. chemical mechanical polishing: CMP) in which the mechanical polishing action of abrasive grains and the chemical polishing action of the alkaline aqueous solution are combined.

Here, in the final polishing step, polishing in two or more stages, including one or more upstream polishing steps performed by one or more upstream polishing units and a finish polishing step subsequently performed by a finish polishing unit. WO 2010/140671 A (PTL 1) describes that in a finish polishing step in a final polishing step, an alkaline aqueous solution containing a water-soluble polymer and abrasive grains having a density of $5 \times 10^{13}/cm^3$ or less is used as a polishing solution, thus a silicon wafer with reduced PIDs (process induced defects) can be obtained.

Further, JP 2016-051763 A (PTL 2) discloses a method of polishing a silicon wafer, comprising: a first polishing step of polishing a surface of the silicon wafer while supplying to a polishing cloth a first polishing liquid comprising: a primary agent in a form of an alkaline aqueous solution; and abrasive grains, the first polishing liquid comprising no water-soluble polymer; subsequent to the first polishing step, a protection film formation step of supplying a protection film formation solution comprising a water-soluble polymer to the polishing cloth after being used in the first polishing step, and bringing the protection film formation solution into contact with the polished surface of the silicon wafer subjected to the first polishing step to form a protection film on the polished surface; and a second polishing step of polishing the surface of the silicon wafer where the protection film is formed by the protection film formation step while supplying, to a polishing cloth different from the polishing cloth used in the first polishing step, a second polishing liquid comprising: a primary agent in a form of an alkaline aqueous solution; abrasive grains; and a water-soluble polymer. This polishing method is a technique of suppressing the formation of water marks which are detrimental in the process from the first polishing step to the second polishing step where a silicon wafer is delivered in the air, by forming the above-described protection film.

CITATION LIST

Patent Literature

PTL 1: WO 2010/140671 A
PTL 2: JP 2016-051763 A

SUMMARY

Technical Problem

PIDs evaluated in PTL 1 are linear protrusion defects as depicted in FIG. 1A of PTL 1, and the mechanism for the formation of those PIDs is considered to be as follows. Abrasive grains and other various kinds of foreign materials in the polishing solution in the process of finish polishing cause linear scratches to the surface of the silicon wafer at a certain probability. the linear scratches are process damaged portions, and the etching rate of the damaged portions is lower than that of the other portions of the wafer surface in subsequent etching steps including the cleaning step immediately after finish polishing and the final cleaning step after examinations; thus, linear protrusions are formed. In PTL 1, the wafer surface is subjected to a measurement using a laser particle counter (SP2 manufacture by KLA Tencor), by which defects classified as LPD-N having a size of 35 nm or more are determined to be PIDs, and the number of the PIDs is evaluated.

According the method of polishing a wafer in PTL 1, in the finish polishing step, the formation of PIDs can indeed be suppressed by reducing the number of abrasive grains to $5 \times 10^{13}/cm^3$ or less. However, according to the studies of the inventors of this disclosure, it was found that the formation of scratches with relatively small depth cannot be sufficiently suppressed by the method of polishing a wafer in PTL 1. The scratches with small depth are exposed by subjecting the wafer surface to a measurement using a laser particle counter (SP3 manufactured by KLA Tencor) in normal mode, and are defects different from the PIDs evaluated in PTL 1.

Further, also in the method of polishing a wafer in PTL 2, reducing scratches with relatively small depth as described above is not considered; according to the studies of the inventors of this disclosure, it was found that the formation of scratches with relatively small depth cannot be sufficiently suppressed also by this polishing method.

It could therefore be helpful to provide a method of polishing a silicon wafer, which can suppress the formation of not only PIDs but also scratches with small depth.

Solution to Problem

We conducted diligent studies with a view to solving the above problem and made the following discoveries. In the conventional final polishing step, the polishing with strong polishing action is performed in the upstream polishing step using a polishing agent having a relatively high alkaline etching rate and containing numerous abrasive grains, and the polishing to achieve higher flatness is performed in the finish polishing step using a polishing agent having a low alkaline etching rate and containing fewer abrasive grains. The wafer immediately after the upstream polishing step is transferred to a finish polishing unit with water being supplied thereto. Here, a surface of the wafer immediately after the upstream polishing step has been made a water-repellent surface due to the above characteristics of the polishing agent used in the upstream polishing step. The inventors considered that when the wafer with its surface being kept water-repellent is transferred and is subjected to finish polishing, the abrasive grains would be aggregated on the wafer surface in the finish polishing stage. Accordingly, they contemplated preventing the aggregation of the abrasive grains on the wafer surface in the finish polishing stage by switching the polishing agent to be supplied to the wafer surface from the polishing agent for the upstream polishing to a polishing agent for finish polishing during the upstream polishing step to thereby making the wafer surface hydrophilic immediately after the upstream polishing step. It was found that the wafer surface having been subjected to the upstream polishing step and the finish polishing step had reduced scratches with small depth.

This disclosure is based on the findings described above and has the following primary features.

(1) A method of polishing a silicon wafer, comprising a final polishing step including:

an upstream polishing step, using an upstream polishing unit including a first plate provided with a first polishing pad on its surface and a first polishing head, of polishing a surface of a silicon wafer by rotating the first plate and the silicon wafer held by the first polishing head while making the silicon wafer in contact with the first polishing pad and supplying a first polishing agent to the first polishing pad; and a subsequent finish polishing step, using a finish polishing unit including a second plate provided with a second polishing pad on its surface and a second polishing head, of further polishing the surface of the silicon wafer by rotating the second plate and the silicon wafer held by the second polishing head while making the silicon wafer in contact with the second polishing pad and supplying a second polishing agent to the second polishing pad, wherein in the upstream polishing step, as the first polishing agent, a first alkaline aqueous solution containing abrasive grains with a density of $1 \times 10^{14}/cm^3$ or more is first supplied, and the supply is then switched to a supply of a second alkaline aqueous solution containing a water-soluble polymer and abrasive grains with a density of $5 \times 10^{13}/cm^3$ or less, after the upstream polishing step, the silicon wafer is detached from the first polishing head and is transferred to the finish polishing unit while supplying water to the surface of the silicon wafer, and the silicon wafer is attached to the second polishing head, and in the finish polishing step, as the second polishing agent, a third alkaline aqueous solution containing a water-soluble polymer and abrasive grains with a density of $5 \times 10^{13}/cm^3$ or less is supplied.

(2) The method of polishing a silicon wafer, according to (1) above, wherein in the upstream polishing step, after a lapse of a polishing time in which a target amount of polishing in the step is achieved, the first polishing agent is switched from the first alkaline aqueous solution to the second alkaline aqueous solution.

(3) The method of polishing a silicon wafer, according to (1) or above, wherein in the upstream polishing step, the second alkaline aqueous solution is supplied for a period of 10 seconds or more.

(4) The method of polishing a silicon wafer, according to any one of (1) to (3) above, wherein in the finish polishing step, an undiluted alkaline solution containing the water-soluble polymer and the abrasive grains is mixed with pure water in a dilution tank, thereby preparing the third alkaline aqueous solution, the prepared third alkaline aqueous solution is supplied to the finish polishing unit using a piping system that communicates with the dilution tank, and before the third alkaline aqueous solution in the dilution tank runs out, the undiluted alkaline solution and the pure water are newly added into the dilution tank to prepare a new portion of the third alkaline aqueous solution.

(5) The method of polishing a silicon wafer, according to (4) above, wherein the undiluted alkaline solution and the pure water are newly added into the dilution tank while the third alkaline aqueous solution remains to take up 10% or more of a volume of the dilution tank.

(6) The method of polishing a silicon wafer, according to any one of (1) to (5) above, wherein in the first to third alkaline aqueous solutions, a mean primary particle diameter of the abrasive grains is in a range of 10 nm to 70 nm.

(7) The method of polishing a silicon wafer, according to any one of (1) to (6) above, wherein in the first to third alkaline aqueous solutions, the abrasive grains include $SiO_2$ particles.

(8) The method of polishing a silicon wafer, according to any one of (1) to (7) above, wherein the first alkaline aqueous solution contains one or more alkalis selected from potassium hydroxide, sodium hydroxide, tetramethylammonium hydroxide, and tetraethylammonium hydroxide, and the second and third alkaline aqueous solutions contain ammonia.

(9) The method of polishing a silicon wafer, according to any one of (1) to (8) above, wherein in the second and third alkaline aqueous solutions, the water-soluble polymer is one or more selected from hydroxyethyl cellulose, polyethylene glycol, and polypropylene glycol, Advantageous Effect The method of polishing a silicon wafer, according to this disclosure can suppress the formation of not only PIDs but also scratches with small depth.

BRIEF DESCRIPTION OF THE DRAWINGS

In the accompanying drawings:

FIG. 2 is a schematic view illustrating a supply mechanism for a polishing agent used in a finish polishing step in a method of polishing a silicon wafer, according to one embodiment of this disclosure;

FIGS. 3A, 3B, 3C, and 3D are LPD maps obtained in Comparative Example 1, Comparative Example 2, Example 1, and Example 2 respectively;

DETAILED DESCRIPTION

A method of polishing a silicon wafer according to one embodiment of this disclosure will be described with reference to FIG. 1. A silicon wafer is produced according to the flowchart of FIG. 1. In the preprocess of Step S1, a slicing step, a lapping step, a beveling step, an etching step, etc. are performed, and the shape of the wafer is formed by double-side polishing (DSP step) of Step S2. The silicon wafer having been subjected to double-side polishing is subjected to cleaning of Step S3 followed by a final polishing step including an upstream polishing step of Step S4 and a finish polishing step of Step S5. The silicon wafer having been subjected to the final polishing step is subjected to cleaning of Step S6 and subsequent examinations of wafer planarization and the presence or absence of visible flaws and stains in Step S7, followed by a final cleaning step of Step S8, and is then subjected to surface inspection in Step S9 to be shipped.

Figure 4:
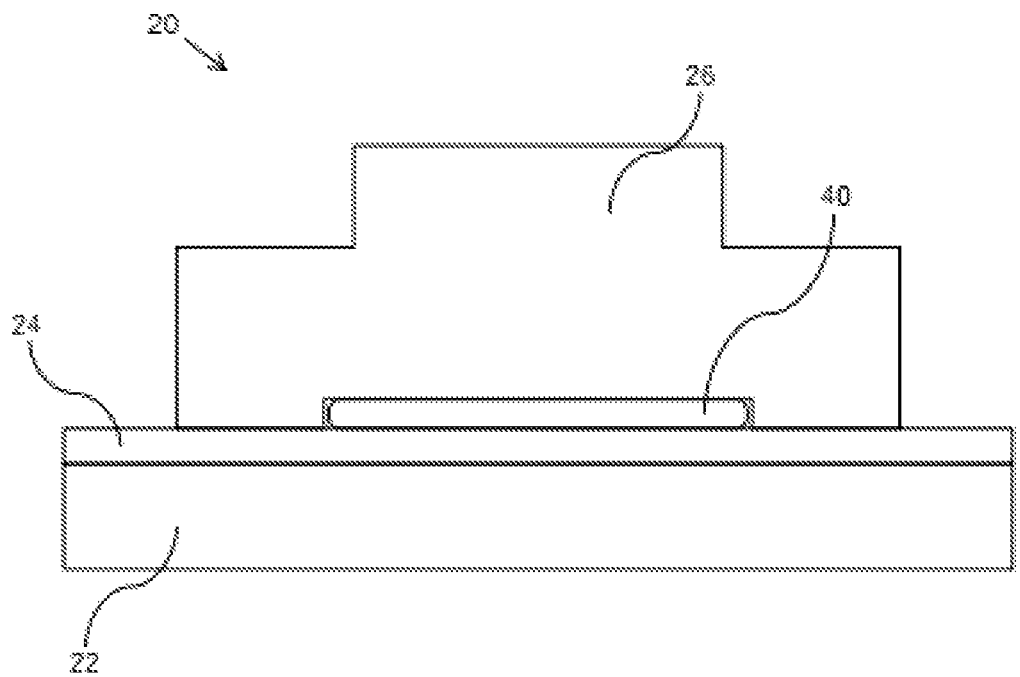
FIG. 4 is a schematic view illustrating an upstream polishing unit used in a finish polishing step in a method of polishing a silicon wafer, according to one embodiment of this disclosure.
Figure 5:
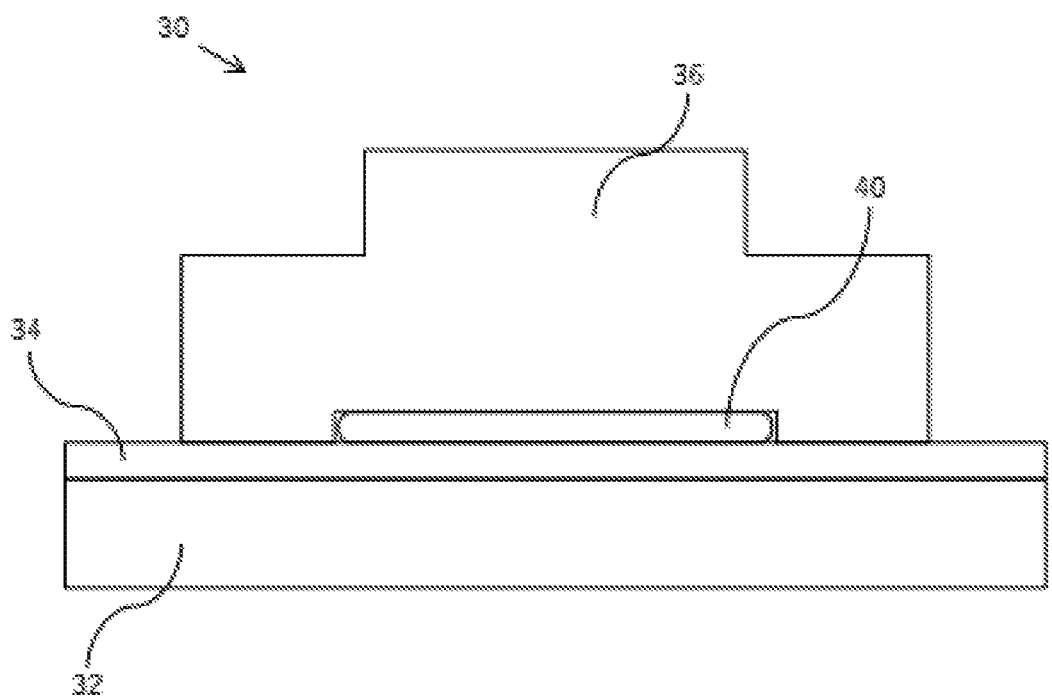
FIG. 5 is a schematic view illustrating a finish polishing unit used in a finish polishing step in a method of polishing a silicon wafer, according to one embodiment of this disclosure.

A method of polishing a silicon wafer according to this embodiment relates to the final polishing step in the above process. The final polishing step is two-stage polishing including the upstream polishing step S4 using the upstream polishing unit, such as illustrated in FIG. 4, and a subsequent finish polishing step S5 using a finish polishing unit, such as illustrated in FIG. 5.

In the upstream polishing step S4, using the upstream polishing unit 20 including a first plate 22 provided with a first polishing pad 24 on its surface and a first polishing head 26, a surface of the silicon wafer 40 is polished by rotating the first plate and the silicon wafer held by the first polishing head while making the silicon wafer in contact with the first polishing pad and supplying a first polishing agent to the first polishing pad.

For the first polishing agent used in the upstream polishing step, a polishing agent having a relatively high alkaline etching rate and containing numerous abrasive grains is preferably used. As such a polishing agent, a first alkaline aqueous solution containing abrasive grains with a density of $1 \times 10^{14}/cm^3$ or more is used in this embodiment. The polishing rate of silicon using the first alkaline aqueous solution is preferably 100 nm/min to 300 nm/min. A polishing rate of 100 nm/min or more would not deteriorate the productivity, and a polishing rate of 300 nm/min or less would not make the wafer surface rough, thus the wafer surface can be uniformly polished. With a view to achieving such a polishing rate, the first alkaline aqueous solution does not contain water-soluble polymers and preferably contains one or more alkalis selected from potassium hydroxide (KOH), sodium hydroxide (NaOH), tetramethylammonium hydroxide (TMAH), and tetraethylammonium hydroxide (TEAH). The density of the abrasive grains is not particularly limited as long as it is $1 \times 10^{14}/cm^3$ or more; however, the density is preferably $1 \times 10^{15}/cm^3$ or less in terms of preventing the aggregation of the abrasive grains. Here, in this embodiment, after the polishing while supplying the above first alkaline aqueous solution, the solution to be supplied is switched to a second alkaline aqueous solution with specifications equivalent to those of a third alkaline aqueous solution as described below.

The wafer immediately after the upstream polishing step is detached from the first polishing head and transferred to the finish polishing unit while supplying water to the wafer surface to prevent the surface from drying. This transfer may also be simply referred to as "underwater transfer". Specifically, the wafer is accommodated in a transfer container and is transferred to the finish polishing unit with water being supplied to the wafer surface. Alternatively, the passage for the wafer transfer may be filled with water, and the wafer may be transferred through the passage. Further, the wafer may be accommodated in a transfer container filled with water, and the container may be transferred.

In the finish polishing step S5, using the finish polishing unit 30 including a second plate 32 provided with a second polishing pad 34 on its surface and a second polishing head 36, the surface of the silicon wafer 40 is further polished by rotating the second plate and the silicon wafer held by the second polishing head while making the silicon wafer in contact with the second polishing pad and supplying a second polishing agent to the second polishing pad.

For the second polishing agent used in the finish polishing step, a polishing agent having a low alkaline etching rate and containing fewer abrasive grains is preferably used. As such a polishing agent, a third alkaline aqueous solution containing a water-soluble polymer and abrasive grains with a density of $5 \times 10^{13}/cm^3$ or less is used in this embodiment. The polishing rate of silicon using the third alkaline aqueous solution is preferably 5 nm/min to 20 nm/min. A polishing rate of 5 nm/min or more does not lead to a long polishing time for achieving a desired amount of polishing, thus would not deteriorate the productivity, and can have a sufficient effect to remove defects formed on the wafer surface in the upstream polishing step. A polishing time of 20 nm/min or less does not result in an excessive etching effect of alkali and thus would not make the roughness of the wafer surface more severe. In terms of obtaining such a polishing rate, the third alkaline aqueous solution contains a water-soluble polymer and preferably contains ammonia. As the water-soluble polymer, one or more selected from hydroxyethyl cellulose (HEC), polyethylene glycol (PEG), and polypropylene glycol (PPG) are preferably used. The density of the abrasive grains is not particularly limited as long as it is $5 \times 10^{13}/cm^3$ or less; however, the density is preferably $2 \times 10^{13}/cm^3$ or more in terms of ensuring the minimum polishing capability thereby reliably improving the smoothness of the wafer surface. Note that since the third alkaline aqueous solution contains the water-soluble polymer, its viscosity is higher than the viscosity of the first alkaline aqueous solution, and the viscosity at a use temperature (18° C. to 25° C.) is preferably 1.5 mPa·s to 5.0 mPa·s. When the viscosity is less than 1.5 mPa·s, the polishing agent would easily flow and a desired etching rate would not be obtained; on the other hand, when the viscosity is 5.0 mPa·s or more, the polishing agent would remain and stick to the wafer surface even if cleaning is performed after finish polishing.

Figure 1:
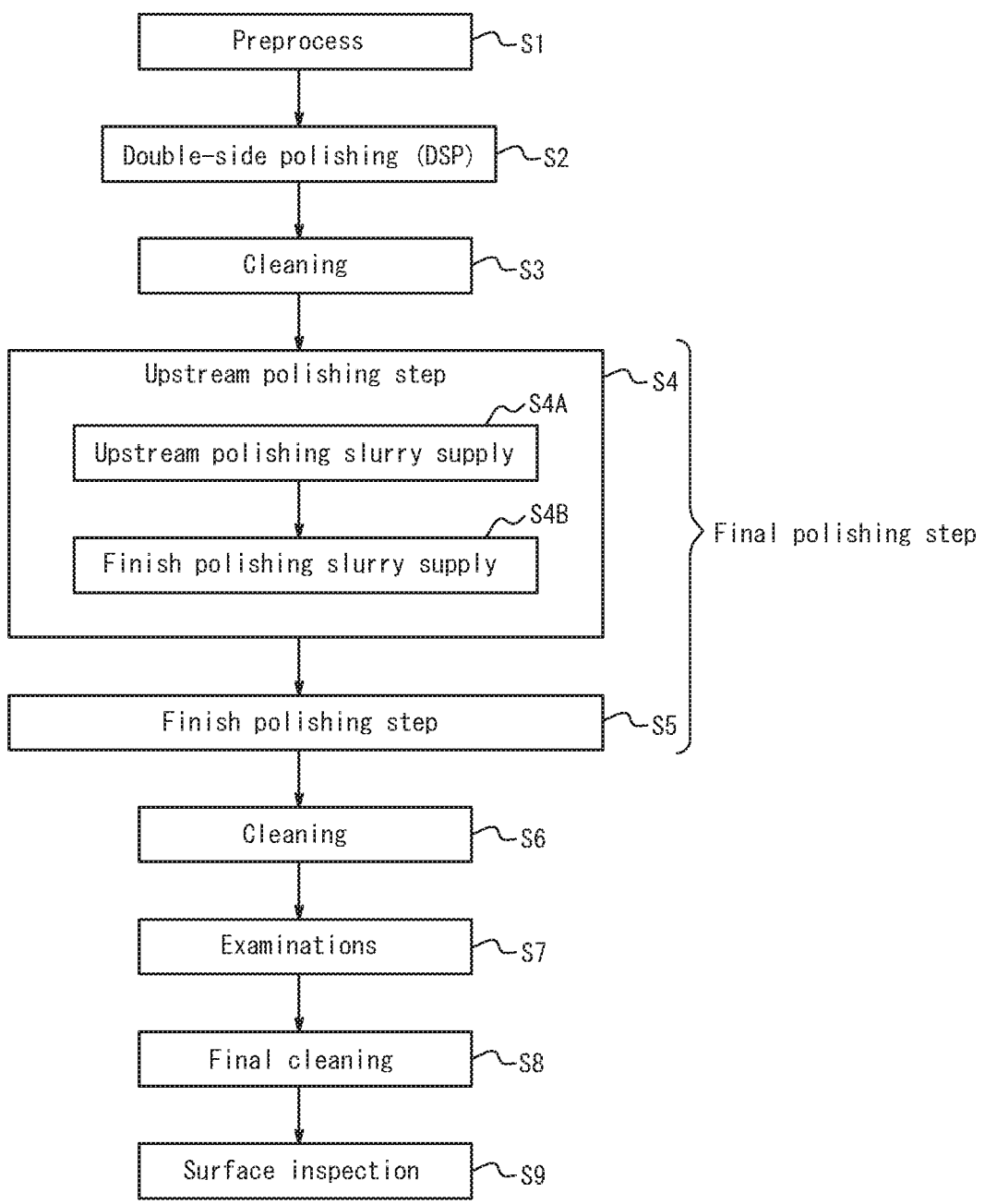
FIG. 1 is a flowchart illustrating the steps for producing a silicon wafer, including a method of polishing a silicon wafer, according to one embodiment of this disclosure.

Here, in this embodiment, as illustrated in FIG. 1, it is important to switch a slurry to be supplied in the upstream polishing step from an upstream polishing slurry (Step S4A) to a finish polishing slurry (Step S4B). Specifically, in the upstream polishing step, as the first polishing agent, the above first alkaline aqueous solution is supplied first, and the supply is switched to the supply of the second alkaline aqueous solution with specifications equivalent to those of the above third alkaline aqueous solution. The second alkaline aqueous solution has specifications equivalent to those of the third alkaline aqueous solution used in finish polishing, and must contain a water-soluble polymer and abrasive grains with a density of $5 \times 10^{13}/cm^3$ or less. Other requirements for the second alkaline aqueous solution are the same as those for the aforementioned third alkaline aqueous solution.

In this embodiment, the formation of not only PIDs but also scratches with small depth can be suppressed by such a switching of polishing agents, and the inventors consider its operation to be as follows.

(1) The second alkaline aqueous solution has fewer abrasive grains than the first alkaline aqueous solution, thus abrasive grains left on the wafer surface are less likely to be aggregated during the underwater transfer from the upstream polishing unit to the finish polishing unit.

(2) The water-soluble polymer contained in the second alkaline aqueous solution protects the wafer surface undergoing underwater transfer, thus abrasive grains left on the wafer surface are less likely to be aggregated during the underwater transfer.

(3) When finish polishing is started, the composition of the agent (the second alkaline aqueous solution) left on the wafer surface is similar to the second polishing agent to be supplied (the third alkaline aqueous solution), so that the pH of the second polishing agent hardly changes on the wafer surface, thus the abrasive grains are less likely to be aggregated.

(4) It is important that the second alkaline aqueous solution contains abrasive grains albeit less than those contained in the first alkaline aqueous solution. Since the concentration of abrasive grains in the first alkaline aqueous solution used in the upstream polishing is high, the abrasive grains are easily aggregated and attached to the wafer. Here, if the second alkaline aqueous solution does not contain abrasive grains and only contains a water-soluble polymer like the solution for forming a protective film, described in PTL 2, a protective film of the water-soluble polymer is formed on the wafer surface; however, this is not sufficient to fully remove the abrasive grains attached to the wafer. In this embodiment, the abrasive grains in the second alkaline aqueous solution that are aggregated on and attached to the wafer surface in upstream polishing are removed, thus fewer abrasive grains are attached to the wafer surface in the subsequent stages of the transfer and the start of finish polishing. Also in this aspect, as described above, the density of the abrasive grains in the second alkaline aqueous solution is preferably $2 \times 10^{13}/cm^3$ or more.

Note that the operations of (1) and (2) above are operations achieved provided that the transfer from the upstream polishing unit to the finish polishing unit is performed by underwater transfer. Accordingly, in this embodiment, the underwater transfer is also one of the important steps in order to suppress the formation of scratches with small depth. Further, the underwater transfer can also prevent the formation of water marks caused by drying and thickening of the first alkaline aqueous solution used in the upstream polishing on the wafer surface. Even if the abrasive grains in the first alkaline aqueous solution used in upstream polishing are attached to the side surfaces and the beveled portions of the wafer, those abrasive grains can be removed by the underwater transfer.

The timing of switching the polishing agents is not particularly limited; however, in the upstream polishing step, the agent to be supplied is preferably switched from the first alkaline aqueous solution to the second alkaline aqueous solution after a lapse of a polishing time in which a target amount of polishing in the step is achieved.

Further, in terms of fully achieving the above operations and effects of switching the polishing agents, in the upstream polishing step, the second alkaline aqueous solution is preferably supplied for a period of 10 s or more. Although the upper limit of the period is not particularly limited, it is preferably 300 s or less in terms of productivity.

In the first to third alkaline aqueous solutions, the mean primary particle diameter of the abrasive grains is preferably in a range of 10 nm to 70 nm. When the particle diameter is less than 10 nm, the abrasive grains are aggregated to form coarse particles with a large particle diameter and the coarse particles would cause PIDs; on the other hand, when the particle diameter exceeds 70 nm, since the particle diameter is excessively large, the roughness of the wafer surface after polishing would be more severe. Note that "mean primary particle diameter" herein refers to a value of the specific surface area of spherical particles calculated by the BET method (a method of calculating the specific surface area of a sample from the amount of molecules of which adsorption cross-section area has been determined are adsorbed on the surfaces of powder particles at a temperature of liquid nitrogen), converted into the diameter of the spherical particles.

In the first to third alkaline aqueous solutions, the abrasive grains used may include ceramics such as silica or alumina: diamond or silicon carbide alone or a compound thereof; a high molecular weight polymer such as polyethylene or polypropylene; etc.; however, the abrasive grains preferably include $SiO_2$ particles for reasons of low cost, dispersibility in the polishing agents, easy control of the diameter of abrasive grains, etc. In addition, $SiO_2$ particles used may be, for example, prepared by either a dry process (combustion process/arc process) or a wet process (sedimentation process/sol-gel process)." The abrasive grains to be used may have a spherical shape, a cocoon-like shape, etc.

The first to third alkaline aqueous solutions preferably do not contain an oxidizing agent (such as hydrogen peroxide ($H_2O_2$), sodium persulfate, etc.). When an oxidizing agent is contained, not only is the wafer surface oxidized and is the etching rate reduced, but the abrasive grains are attached to the surface during the oxidation to cause PIDs.

For the second polishing pad, a material of non-woven cloth, suede, polyurethane foam, polyethylene foam, porous fluorine resin, etc. can be used.

Next, in this embodiment, the formation of scratches with small depth can be more fully suppressed by devising a method of supplying the third alkaline aqueous solution (second polishing agent) in the finish polishing step as follows. This point is described with reference to FIG. 2. FIG. 2 is a schematic view illustrating a system for supplying the polishing agent used in the finish polishing step. In the finish polishing step, an undiluted alkaline solution containing a water-soluble polymer and abrasive grains and pure water are mixed in a dilution tank 10 to dilute the undiluted alkaline solution several ten-fold, thereby preparing the third alkaline aqueous solution. Specifically, on this occasion, preferably, pure water is added into the dilution tank 10 through a pure water pipe 16, a desired amount of the undiluted alkaline solution is then added into the dilution tank 10 through an undiluted solution pipe 14, and pure water is then added again. After the undiluted alkaline solution is first introduced into the dilution tank 10, when pure water is supplied in addition, bubbling occurs due to the influence of the water-soluble polymer in the undiluted alkaline solution, and the aggregation of abrasive grains in the polishing agent easily occurs. To address this problem, pure water is first supplied so that the pure water liquid level will be higher than an outlet port of the undiluted solution pipe 14 in the tank, and the undiluted alkaline solution is then supplied, followed by another supply of pure water. Subsequently, the liquid mixture of the pure water and the undiluted alkaline solution is stirred. The method of stirring the liquid mixture is not particularly limited; for example, the stirring can be performed using a circulating pump, or may be performed by placing a stirring device including a stir bar having a given shape and its drive unit, in the tank.

The prepared third alkaline aqueous solution is supplied to a polishing apparatus (finish polishing unit) by a piping system that communicates with the dilution tank 10. Specifically, the third alkaline aqueous solution is transported to the finish polishing unit through a supply pipe 18 that communicates with the bottom of the dilution tank 10. When the second alkaline aqueous solution used in the upstream polishing step has specifications equivalent to those of the third alkaline aqueous solution, the third alkaline aqueous solution is transported to the upstream polishing unit through the supply pipe 18 that communicates with the bottom of the dilution tank 10, and the solution may be used as the second alkaline aqueous solution.

Here, in the case where the prepared third alkaline aqueous solution is all transported to the finish polishing unit from the dilution tank 10 and, after the dilution tank 10 is emptied, the undiluted alkaline solution and pure water are newly added into the dilution tank and are stirred to prepare a new (fresh) third alkaline aqueous solution; the pH of the liquid greatly changes and thus abrasive grains are aggregated, and this was found to result in the formation of scratches with small depth. This being the situation, in this embodiment, before the third alkaline aqueous solution in the dilution tank 10 runs out, the undiluted alkaline solution and pure water are newly added into the dilution tank 10 to prepare a new third alkali solution. Thus, the change in the pH of the liquid can be reduced; consequently, the abrasive grains are hardly aggregated and the formation of scratches with small depth can be more fully suppressed.

In order to achieve such operation and effect, the undiluted alkaline solution and pure water are preferably newly added into the dilution tank 10 while the third alkaline aqueous solution remains to take up 10% or more of the volume of the dilution tank 10. Further, in terms of productivity, the undiluted alkaline solution and pure water are preferably newly added into the dilution tank 10 while the third alkaline aqueous solution remains to take up 50% or less of the volume of the dilution tank 10.

The silicon wafer having been subjected to the final polishing step described above is subjected to cleaning (typically cleaning with sulfuric acid and ozone) of Step S6 after rinsing and underwater storage within 24 hours from the end of the final polishing step. Performing underwater storage and performing cleaning before components of the polishing agent and abrasive grains stick to the wafer surface can reduce PIDs.

The above embodiment described an example of two-stage polishing including one upstream polishing step S4 using one upstream polishing unit and a subsequent finish polishing step S5 using the finish polishing unit as illustrated in FIG. 1. However, this disclosure is not limited to the above embodiment, and the upstream polishing step may be performed using two or more upstream polishing units. In this case, a plurality of upstream polishing steps may be performed using a plurality of upstream polishing units, in which case the last step of the upstream polishing steps may correspond to S4 in FIG. 1.

EXAMPLES

Comparative Example 1

According to a conventional method, 25 silicon wafers with a diameter of 300 mm having been subjected to cleaning after double-side polishing were subjected to a final polishing step under the following conditions. In an upstream polishing step, as a first polishing agent, a first alkaline aqueous solution which does not contain a water-soluble polymer, contains TMAH as an alkali, and contains abrasive grains ($SiO_2$ particles with a mean primary particle diameter of 35 nm) with a density of $2.5 \times 10^{14}/cm^3$ was supplied. The polishing rate of silicon using the first alkaline aqueous solution was 200 nm/min. The polishing time was 300 s.

In a finish polishing step, as a second polishing agent, a third alkaline aqueous solution containing HEC as a water-soluble polymer, containing ammonia as an alkali, and containing abrasive grains with a density of $5 \times 10^{13}/cm^3$ ($SiO_2$ particles with a mean primary particle diameter of 35 nm) was supplied. The polishing rate of silicon using the third alkaline aqueous solution was 10 nm/min and the viscosity of the solution at 25° C. was 3 mPa·s. The polishing time was 300 s. For the method of supplying the second polishing agent in the finish polishing step, an undiluted alkaline solution and pure water were newly added into a dilution tank having been emptied and were mixed to prepare a new polishing agent.

The silicon wafer having been subjected to the final polishing step was subjected to cleaning, examinations, and a final cleaning step according to conventional methods. Further, the evaluation of PIDs and scratches with small depth on the silicon wafer was performed by surface inspection as follows.

Example 1

Polishing was performed under the same conditions as Comparative Example 1 above except for the following points, and the evaluation of PIDs and scratches with small depth was performed. Specifically, in Example 1, in the upstream polishing step, after polishing using the above first alkaline aqueous solution for 300 s was performed, the polishing agent to be supplied was switched to a second alkaline aqueous solution having specifications equivalent to those of the above third alkaline aqueous solution, and polishing was further performed for 30 s.

Comparative Example 2

Polishing was performed under the same conditions as Example 1 above except for the following points, and the evaluation of PIDs and scratches with small depth was performed. Specifically, in Comparative Example 2, an alkaline aqueous solution having the same specifications as the above third alkaline aqueous solution except for not containing abrasive grains was used as the second alkaline aqueous solution.

Example 2

Polishing was performed under the same conditions as Example 1 above except for the following points, and the evaluation of PIDs and scratches with small depth was performed. Specifically, in Example 2, for the method of supplying the second polishing agent in the finish polishing step, an undiluted alkaline solution and pure water were newly added into the dilution tank before the third. alkaline aqueous solution in the dilution tank ran out (specifically, at the time when the third alkaline aqueous solution remained to take up 20% of the volume of the dilution tank) and were mixed to prepare a new polishing agent.

<Evaluation of PIDs>

The surface of each wafer was subjected to a measurement using a laser particle counter (SP2 manufactured by KLA Tencor) and defects with a size of 35 nm or more that were classified as LPD-N were determined as PIDs, and the number of the defects was counted. The average of the number of defects in the 25 silicon wafers was three in Comparative Example 1, three in Comparative Example 2, two in Example 1, and one in Example 2. Thus, the formation of PIDs was fully suppressed in all Comparative Examples 1, 2, and Examples 1, 2.

<Evaluation of Scratches with Small Depth>

The surface of each wafer was subjected to a measurement using a laser particle counter (SP3 manufactured by KLA Tencor) in normal mode, and a map of the wafer surface was created using LPDs detected as defects with a size of 36 nm or more, wherein rows of detected defects observed as long lines depicted in FIG. 3 were recognized as shallow scratches. Note that FIGS. 3A to 3D each illustrate an LPD map of the 25 wafers that were overlaid. In Comparative Example 1, scratches were formed in 15 out of 25 of the wafers, and as is evident from FIG. 3A, long scratches had a length of approximately 140 mm that was close to the radius of the wafer. In Comparative Examples 2, scratches were formed in 15 out of 25 of the wafers.

On the other hand, in Example 1, scratches were formed in 10 out of 25 of the wafers, thus scratches were fairly reduced as compared with Comparative Examples 1 and 2, and the length of the detected scratches was significantly smaller than in Comparative Examples 1 and 2. In Example 2, no scratch was formed in the 25 wafers.

INDUSTRIAL APPLICABILITY

According to the disclosed method of polishing a silicon wafer, the formation of not only PIDs but also scratches with small depth can be suppressed.

REFERENCE SIGNS LIST

10 Dilution tank
14 Undiluted solution pipe
16 Pure water pipe
18 Supply pipe
20 Upstream polishing unit
22 First plate
24 First polishing pad
26 First polishing head
30 Finish polishing unit
32 Second plate
34 Second polishing pad
36 Second polishing head
40 Silicon wafer

The invention claimed is:

1. A method of polishing a silicon wafer, comprising a final polishing including:
an upstream polishing, using an upstream polishing unit including a first plate provided with a first polishing pad on its surface and a first polishing head, of polishing a surface of a silicon wafer by rotating the first plate and the silicon wafer held by the first polishing head while making the silicon wafer in contact with the first polishing pad and supplying a first polishing agent to the first polishing pad; and
a subsequent finish polishing, using a finish polishing unit including a second plate provided with a second polishing pad on its surface and a second polishing head, of further polishing the surface of the silicon wafer by rotating the second plate and the silicon wafer held by the second polishing head while making the silicon wafer in contact with the second polishing pad and supplying a second polishing agent to the second polishing pad,
wherein in the upstream polishing, as the first polishing agent, a first alkaline aqueous solution containing abrasive grains with a density of $1 \times 10^{14}$ grains/cm$^3$ or more is first supplied to perform the polishing at a polishing rate of 100 nm/min to 300 nm/min, and the supply is then switched to a supply of a second alkaline aqueous solution containing a water-soluble polymer and abrasive grains with a density of $5 \times 10^{13}$ grains/cm$^3$ or less to perform the polishing at a polishing rate of 5 nm/min to 20 nm/min,
after the upstream polishing, the silicon wafer is detached from the first polishing head and is transferred to the finish polishing unit while supplying water to the surface of the silicon wafer, and the silicon wafer is attached to the second polishing head, and
in the finish polishing, as the second polishing agent, a third alkaline aqueous solution containing a water-soluble polymer and abrasive grains with a density of $5 \times 10^{13}$ grains/cm$^3$ or less is supplied to perform the polishing at a polishing rate of 5 nm/min to 20 nm/min.

2. The method of polishing a silicon wafer, according to claim 1, wherein in the upstream polishing, after a lapse of a polishing time in which a target amount of polishing is achieved, the first polishing agent is switched from the first alkaline aqueous solution to the second alkaline aqueous solution.

3. The method of polishing a silicon wafer, according to claim 1, wherein in the upstream polishing, the second alkaline aqueous solution is supplied for a period of 10 seconds or more.

4. The method of polishing a silicon wafer, according to claim 1, wherein in the finish polishing, an undiluted alkaline solution containing the water-soluble polymer and the abrasive grains is mixed with pure water in a dilution tank, thereby preparing the third alkaline aqueous solution,
the prepared third alkaline aqueous solution is supplied to the finish polishing unit using a piping system that communicates with the dilution tank, and
before the third alkaline aqueous solution in the dilution tank runs out, the undiluted alkaline solution and the pure water are newly added into the dilution tank to prepare a new portion of the third alkaline aqueous solution.

5. The method of polishing a silicon wafer, according to claim 4, wherein the undiluted alkaline solution and the pure water are newly added into the dilution tank while the third alkaline aqueous solution remains to take up 10% or more of a volume of the dilution tank.

6. The method of polishing a silicon wafer, according to claim 1, wherein in the first to third alkaline aqueous solutions, a mean primary particle diameter of the abrasive grains is in a range of 10 nm to 70 nm.

7. The method of polishing a silicon wafer, according to claim 1, wherein in the first to third alkaline aqueous solutions, the abrasive grains include $SiO_2$ particles.

8. The method of polishing a silicon wafer, according to claim 1, wherein
   the first alkaline aqueous solution contains one or more alkalis selected from potassium hydroxide, sodium hydroxide, tetramethylammonium hydroxide, and tetraethylammonium hydroxide, and
   the second and third alkaline aqueous solutions contain ammonia.

9. The method of polishing a silicon wafer, according to claim 1, wherein in the second and third alkaline aqueous solutions, the water-soluble polymer is one or more selected from hydroxyethyl cellulose, polyethylene glycol, and polypropylene glycol.

\* \* \* \* \*